United States Patent
Helm et al.

(10) Patent No.: US 10,262,889 B2
(45) Date of Patent: Apr. 16, 2019

(54) INTEGRATED CIRCUIT AND METHOD OF FORMING AN INTEGRATED CIRCUIT

(71) Applicant: Infineon Technologies AG, Neubiberg (DE)

(72) Inventors: Torsten Helm, Bannewitz (DE); Marc Probst, Radeberg (DE); Uwe Rudolph, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/602,245

(22) Filed: May 23, 2017

(65) Prior Publication Data

US 2017/0256437 A1 Sep. 7, 2017

Related U.S. Application Data

(63) Continuation of application No. 13/355,787, filed on Jan. 23, 2012, now abandoned.

(51) Int. Cl.
  *H01L 21/00* (2006.01)
  *H01L 21/74* (2006.01)
  *H01L 23/535* (2006.01)

(52) U.S. Cl.
  CPC .......... *H01L 21/743* (2013.01); *H01L 23/535* (2013.01); *H01L 2924/0002* (2013.01)

(58) Field of Classification Search
  CPC . H01L 21/743; H01L 21/76; H01L 21/76224; H01L 21/76232; H01L 21/763; H01L 23/535; H01L 2924/0002; H01L 27/1087; H01L 27/10861; H01L 27/10876; H01L 21/3144; H01L 21/76229; H01L 21/76205; H01L 21/00; H01L 21/76816; H01L 21/76877; H01L 21/76897; H01L 21/02063; H01L 21/302; H01L 21/31055; H01L 21/31116; H01L 21/31138; H01L 21/67069; H01L 21/31122; H01L 23/5384; H01L 29/94; H01L 29/66704; H01L 29/66613; H01L 29/66621;
  (Continued)

(56) References Cited

U.S. PATENT DOCUMENTS 5,614,750 A  3/1997 Ellul et al.
6,020,270 A  2/2000 Wong et al.
(Continued)

FOREIGN PATENT DOCUMENTS

TW  200711036 A  3/2007

*Primary Examiner* — Natalia A Gondarenko
(74) *Attorney, Agent, or Firm* — Murphy, Bilak & Homiller, PLLC

(57) ABSTRACT

An integrated circuit includes a first trench disposed in a semiconductor material, wherein a width of the first trench in an upper portion of the first trench adjacent to a surface of the semiconductor material is smaller than a width of the first trench in a lower portion of the first trench, the lower portion being disposed within the semiconductor material, each width being measured in a plane parallel to a surface of the semiconductor material, each width denoting a distance between inner faces of remaining semiconductor material portions or between outer faces of a filling disposed in the first trench, or between an inner face of a remaining semiconductor material portion and an outer face of a filling disposed in the first trench.

14 Claims, 11 Drawing Sheets

(58) Field of Classification Search
CPC ............ H01L 2224/05085–2224/05098; H01L 2224/8203–2224/82047; H01L 2223/6616–2223/6622
USPC .......... 257/52, 419, 417, 254; 438/424, 243, 438/386, 430, 433, 259
See application file for complete search history.

(56) References Cited

U.S. PATENT DOCUMENTS

| | | | |
|---|---|---|---|
| 6,184,107 | B1 | 2/2001 | Divakaruni et al. |
| 6,313,008 | B1 | 11/2001 | Leung et al. |
| 6,326,261 | B1 | 12/2001 | Tsang et al. |
| 7,118,986 | B2 | 10/2006 | Steigerwalt et al. |
| 2002/0039818 | A1 | 4/2002 | Lee |
| 2002/0171118 | A1 | 11/2002 | Mandelman et al. |
| 2003/0025141 | A1 | 2/2003 | Grimm |
| 2004/0248375 | A1 | 12/2004 | McNeil et al. |
| 2004/0259368 | A1 | 12/2004 | Lai |
| 2005/0223232 | A1 | 10/2005 | Anderson et al. |
| 2006/0237723 | A1 | 10/2006 | Ito |
| 2006/0261444 | A1 | 11/2006 | Grivna et al. |
| 2007/0018215 | A1* | 1/2007 | Sandhu ............ H01L 21/76232 257/296 |
| 2007/0059897 | A1 | 3/2007 | Tilke et al. |
| 2007/0155101 | A1 | 7/2007 | Lee et al. |
| 2007/0158718 | A1 | 7/2007 | Su |
| 2008/0042211 | A1 | 2/2008 | Bhattacharyya et al. |
| 2008/0213972 | A1 | 9/2008 | Disney et al. |
| 2008/0290448 | A1 | 11/2008 | Tilke et al. |
| 2008/0318392 | A1 | 12/2008 | Hung et al. |
| 2009/0020811 | A1 | 1/2009 | Voldman |
| 2009/0026522 | A1 | 1/2009 | Ananthan |
| 2010/0032767 | A1 | 2/2010 | Chapman et al. |
| 2010/0171170 | A1 | 7/2010 | Hwang et al. |
| 2010/0171179 | A1 | 7/2010 | Liu et al. |
| 2011/0003457 | A1 | 1/2011 | Schuler et al. |
| 2011/0037339 | A1 | 2/2011 | Rahman et al. |
| 2011/0256688 | A1 | 10/2011 | Meiser et al. |
| 2012/0267758 | A1 | 10/2012 | Shroff et al. |
| 2013/0228928 | A1 | 9/2013 | Kuge et al. |

\* cited by examiner

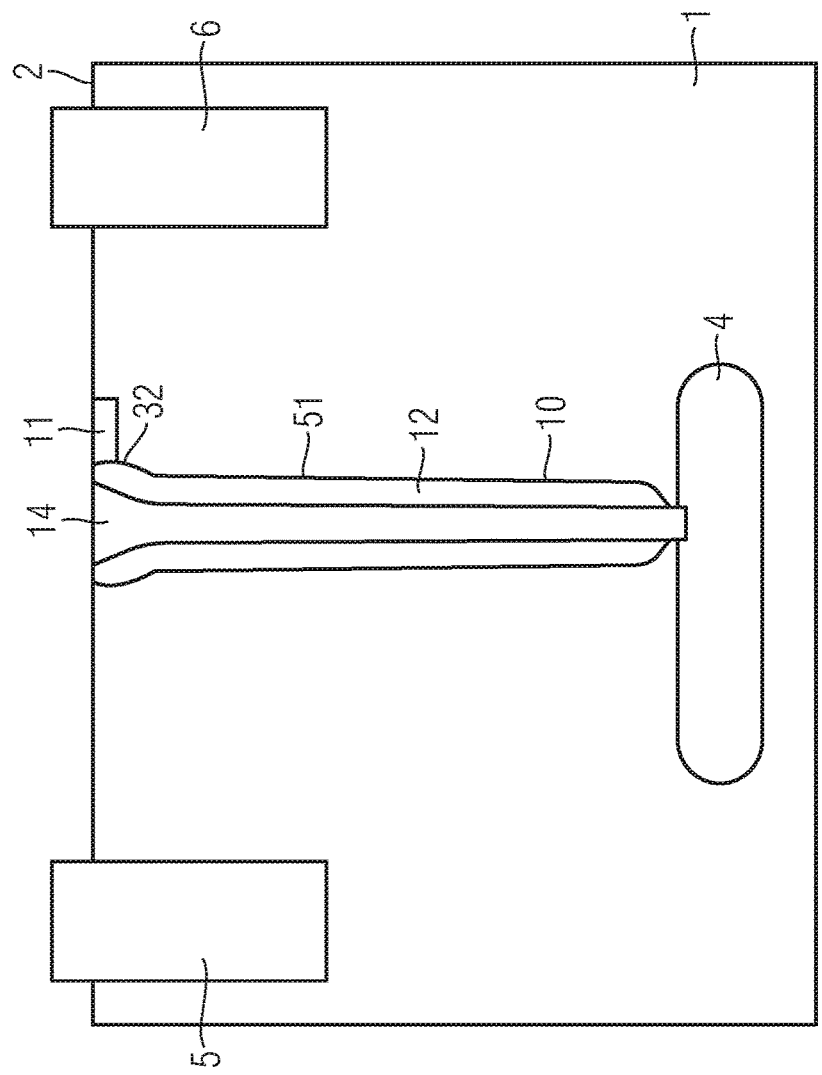

INTEGRATED CIRCUIT AND METHOD OF FORMING AN INTEGRATED CIRCUIT

PRIORITY CLAIM

This application is a continuation of U.S. application Ser. No. 13/355,787 filed on 23 Jan. 2012, the content of said application incorporated herein by reference in its entirety.

BACKGROUND

In the field of integrated circuits including, in particular, semiconductor devices, isolation structures are commonly used for defining active regions in semiconductor substrates and for insulating adjacent functional units from each other. For example, according to the so-called shallow trench isolation (STI) technology, a shallow isolation trench filled with an insulating material is formed at the surface of a semiconductor substrate. Moreover, according to the deep trench isolation (DTI) technology deep isolation trenches filled with an insulating material are formed in the semiconductor material. For example, a conductive material may be disposed in these deep isolation trenches, the conductive material being insulated from the semiconductor material by the insulating material. The conductive material in the deep isolation trenches accomplishes a contact to an underlying buried layer, or further shields electrical fields. In order to provide an effective isolation even in case of high voltages, improvements of existing deep trench isolation technology are searched for. Accordingly, it would be desirable to provide integrated circuits comprising trenches which can withstand increasing higher voltages.

SUMMARY

According to an embodiment, an integrated circuit comprises a first trench disposed in a semiconductor material, wherein a width of the first trench in an upper portion of the first trench adjacent to a surface of the semiconductor material is smaller than a width of the first trench in a lower portion of the first trench, the lower portion being disposed within the semiconductor material, each width being measured in a plane parallel to a surface of the semiconductor material, each width denoting a distance between inner faces of remaining semiconductor material portions or between outer faces of a filling disposed in the first trench, or between an inner face of a remaining semiconductor material portion and an outer face of a filling disposed in the first trench.

According to an embodiment, a method of forming an integrated circuit, comprises forming a first trench in a semiconductor material, wherein the first trench is formed so that a width of the first trench in an upper portion of the first trench adjacent to a surface of the semiconductor material is smaller than a width of the first trench in a lower portion of the first trench, the lower portion being disposed within the semiconductor material, each width being measured in a plane parallel to a surface of the semiconductor material, each width denoting a distance between inner faces of remaining semiconductor material portions or between outer faces of a filling disposed in the first trench, or between an inner face of a remaining semiconductor material portion and an outer face of a filling disposed in the first trench.

According to an embodiment, an integrated circuit comprises a first trench disposed in a semiconductor material, the first trench comprising a curved first sidewall, wherein an angle $\delta$ between a tangent to the first sidewall in an upper portion of the first trench and a surface of the remaining semiconductor material is smaller than 90°, the upper portion of the first trench being adjacent to the surface of the semiconductor material, and an angle $\gamma$ between a tangent to the first sidewall in a lower portion of the first trench and the surface of the remaining semiconductor material is greater than the angle $\delta$, the lower portion being disposed within the semiconductor material.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1A shows a cross-sectional view of an integrated circuit according to an embodiment;

DETAILED DESCRIPTION

Figure 1B:
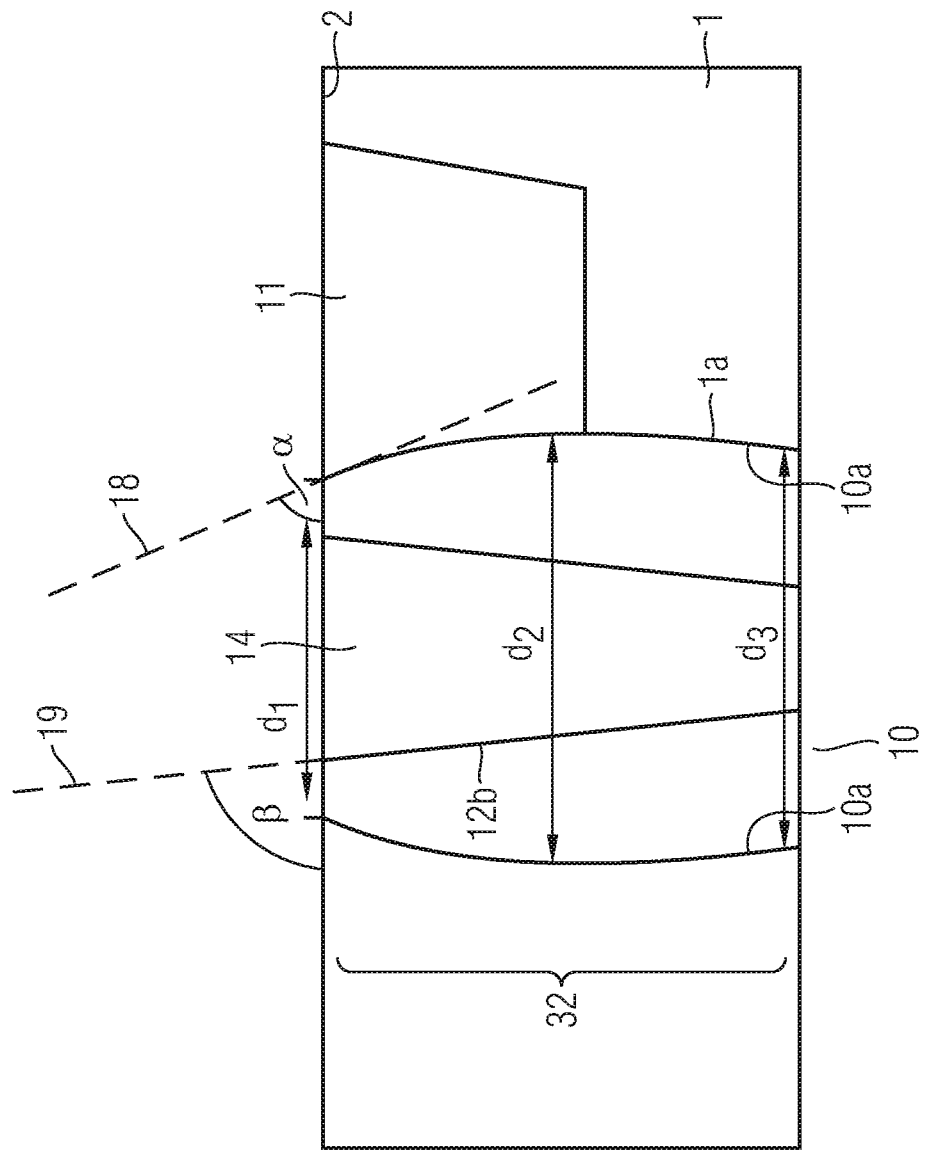
FIG. 1B shows an enlarged portion of the integrated circuit of FIG. 1A.

In the following detailed description reference is made to the accompanying drawings, which form a part hereof and in which is illustrated by way of illustration specific embodiments in which the invention may be practiced. In this regard, directional terminology such as "top", "bottom", "front", "back", "leading", "trailing", etc., is used with reference to the orientation of the Figures being described. Since components of embodiments of the present invention can be positioned in a number of different orientations, the directional terminology is used for purposes of illustration and in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

Further, terms, such as "first", "second", and the like, are also used to describe various elements, regions, sections etc, and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

FIG. 1A shows a cross-sectional view of an integrated circuit according to an embodiment. A semiconductor substrate 1 may, for example, comprise a base semiconductor element, buried layer portions 4, which may be present as sections or which may extend over the whole lateral extension of the substrate, and further semiconductor portions which may, for example, be epitaxially grown over the semiconductor base element. Semiconductor functional units 5, 6, may be disposed in the semiconductor substrate 1. The semiconductor functional units 5, 6, may, for example, be formed in an epitaxial layer. The semiconductor functional units 5, 6 may comprise further doped portions, for example, impurity implanted portions. Portions of the semiconductor functional units 5, 6 may be disposed above or below the semiconductor substrate surface 2. For example, the semiconductor functional unit 5 may contain logic circuits, memory cells or components such as transistors, diodes, capacitors or others. For example the transistors may comprise any devices formed in CMOS, bipolar and CMOS technology. Although various epitaxial layers may be formed over the semiconductor base element, the substrate surface 2 is the uppermost surface of monocrystalline semiconductor material.

For example, the semiconductor substrate 1 may be lightly doped p-Si, while the buried layer 4 is a highly doped n-Si layer. Nevertheless, as is clearly to be understood, the doping of the components may depend on the specific purpose, the integrated circuit is made for, and the above explanation is only by way of illustration.

FIG. 1A illustrates by way of example an integrated circuit comprising various components that are formed in an epitaxially grown semiconductor layer. Nevertheless, as is clearly to be understood, various components and, in particular, the trenches or isolation trenches which are described in the following can likewise be formed in any other semiconductor material, for example, a polycrystalline or amorphous semiconductor material.

A first isolation trench 10 is formed in the semiconductor substrate 1 so as to extend from the substrate surface 2 into a depth direction of the semiconductor substrate 1. For example, the first isolation trench 10 may perpendicularly extend from the substrate surface 2.

For example, the first isolation trench 10 may extend to the buried layer portion 4. An insulating layer 12 may be formed on the sidewalls of the first isolation trench 10. Further, a conductive filling 14 may be disposed in the inside of the first isolation trench 10. For example, the conductive filling 14 may be insulated from the semiconductor substrate 1 by the insulating layer 12. For example, the conductive filling 14 may contact the buried layer portion 4.

The first isolation trench 10 may comprise a widened trench portion 32 and an extended trench portion 51. The widened trench portion 32 is adjacent to the substrate surface 2. The extended trench portion 51 extends from the widened trench portion 32 to the buried layer portion 4. A width of the extended trench portion 51 is smaller than a width of the widened trench portion 32. For example, the largest width of the widened trench portion 32 is larger than the width of the extended trench portion 51. For example, the width of the extended trench portion 51, in particular in a region adjacent to the widened trench portion 32, may be equal to the width of the widened trench portion 32 in the region adjacent to the substrate surface 2. The integrated circuit may further comprise a second isolation trench 11. The first isolation trench 10 insulates adjacent semiconductor functional units 5, 6, from each other. Further, due to the presence of the conductive material 14 in the first isolation trench 10, an electrical contact to the buried layer portion 4 may be accomplished. The first isolation trench 10 is also referred as "deep trench isolation". The second isolation trench 11, which is also referred to as "shallow trench isolation" also insulates adjacent semiconductor functional units 5, 6 from each other.

In the context of the present application, the width of a trench is measured in a plane parallel to the substrate surface. Moreover, the width is measured in a direction which is perpendicular to the extension direction of the extended trench portion 51.

FIG. 1B shows an enlarged cross-sectional view of the upper portion of the first and second isolation trenches 10, 11. As is shown in FIG. 1B, a first isolation trench 10 is disposed in the semiconductor substrate 1, wherein a width d1 of the first trench 10 in an upper portion of the first trench 10 adjacent to the surface 2 of the semiconductor substrate 1 is smaller than a width d2 of the trench 10 in a lower portion of the trench 10. A width d3 corresponds to the width of the widened trench portion 32 at a portion adjacent to the extended trench portion 51. The lower portion of the trench 10 is disposed within the semiconductor substrate 1. The width is measured in a plane parallel to the surface of the semiconductor substrate 1 and the width denotes the distance between the inner faces 1a of remaining substrate portions or between outer faces 10a of the filling disposed in the first trench 10 or between an inner face of a remaining substrate portion 1a and an outer face 10a of the filling of the first trench 10.

As is shown in FIG. 1B, d2>d1 and d2>d3. Moreover, d2 is larger than a width of the first isolation trench 10 in the extended trench portion 51. Further, a depth of the second isolation trench 11 is smaller than a depth of the widened trench portion 32. For example, the maximum of the width d2 may be at a depth which corresponds to a depth of the second isolation trench 11. For example, this depth may be 350 nm to 450 nm, for example 380 to 410 nm.

FIG. 1B also shows a tangent 18 which is adjacent to the inner face 1a of the remaining substrate portion. An angle α of the tangent 18 with respect to the imaginary semiconductor surface 2 measured from the opening in which the first isolation trench 10 is formed, is less than 90°, for example, less than 85°. A further tangent 19 may be adjacent to the inner face 12b of the insulating layer 12. An angle β between the surface of the insulating layer 12 and the tangent 19 may be less than 90°, for example, less than 85°.

Figure 10:
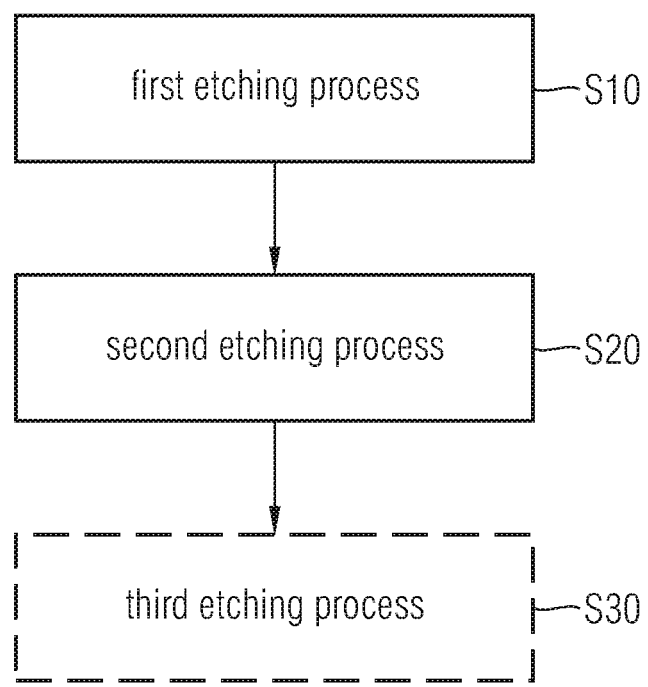
FIG. 10 is a schematic diagram illustrating a method of forming an integrated circuit.

As is shown in FIG. 10, a first isolation trench 10 is disposed in a semiconductor material 1, the first isolation trench 10 comprising a first sidewall 1a of remaining semiconductor material, the first sidewall 1a being curved in the widened trench portion 32. An angle δ between a first tangent 61 to the first sidewall 1a in an upper portion of the first isolation trench 10 and the surface 2 of the remaining semiconductor material 1, measured along the semiconductor material 1, is smaller than 90°. The upper portion of the first isolation trench 10 is adjacent to a surface 2 of the semiconductor material 1. For example, the angle δ may be less than 85°. An angle γ between a second tangent 62 to the first sidewall 1a in a lower portion of the first isolation trench 10 and the surface 2 of the remaining semiconductor material is greater than the angle δ, the lower portion being disposed within the semiconductor material 1. For example, the angle γ may be up to more than 90°. A portion at which the angle γ is 90° may correspond to a portion in the widened trench portion 32 at which the width d2 has its maximum. As a further example, the angle γ between the tangent 62 being adjacent to the sidewall 1a at the lower side of the second isolation trench 11 is less than or equal to 90°. The first trench 10 may further comprise an extension region 51 extending in a depth direction of the semiconductor material 1. A second sidewall 511 of the extension region 51 may have the form of a straight line in the cross-sectional view taken perpendicularly to the substrate surface 2. The second sidewall 511 may have the form of a straight line at least in an upper portion which is adjacent to the widened trench portion 32. For example, an angle between the second sidewall 511 and the semiconductor material 1 is greater than the angle δ.

Figure 1C:
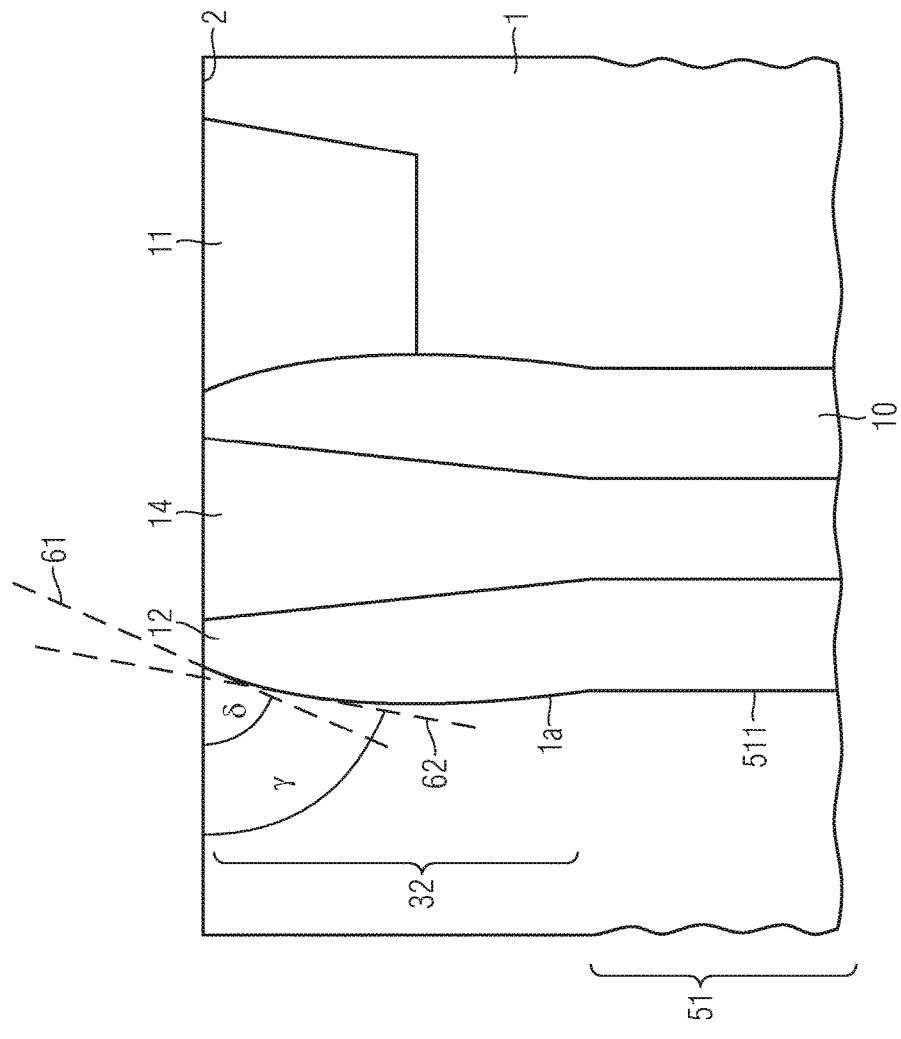
FIG. 1C shows a further view of an enlarged portion of the integrated circuit of FIG. 1A.
Figure 2:
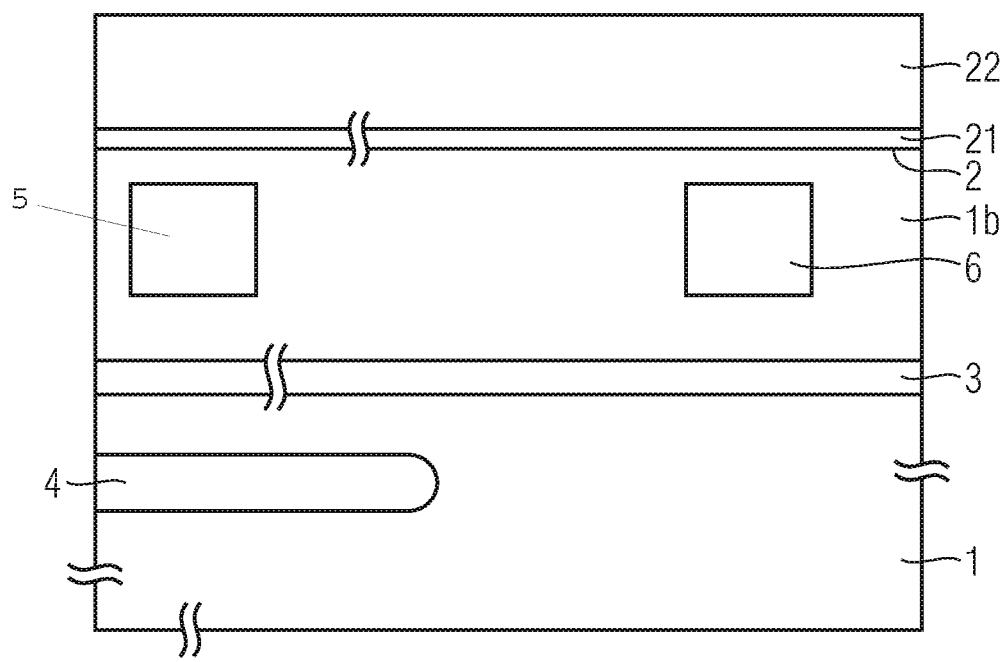
FIGS. 2 to 9 illustrate processes of manufacturing an integrated circuit according to an embodiment.

In the following, a method of forming the integrated circuit shown in FIG. 1 will be illustrated. The described processing steps are only given as examples. As is to be clearly understood, different processing steps may be used for forming the respective components. FIG. 2 shows a semiconductor substrate 1, which may be taken as a starting material for performing the method according to an embodiment. As shown in FIG. 2, buried layer portions 3, 4 may be formed in a semiconductor substrate 1. Further, epitaxial layer portions 1b may be formed over buried layers 3 as is conventional. Semiconductor functional units 5, 6 may be disposed within the epitaxial layer portion 1b or within the semiconductor substrate portion.

Figure 3:
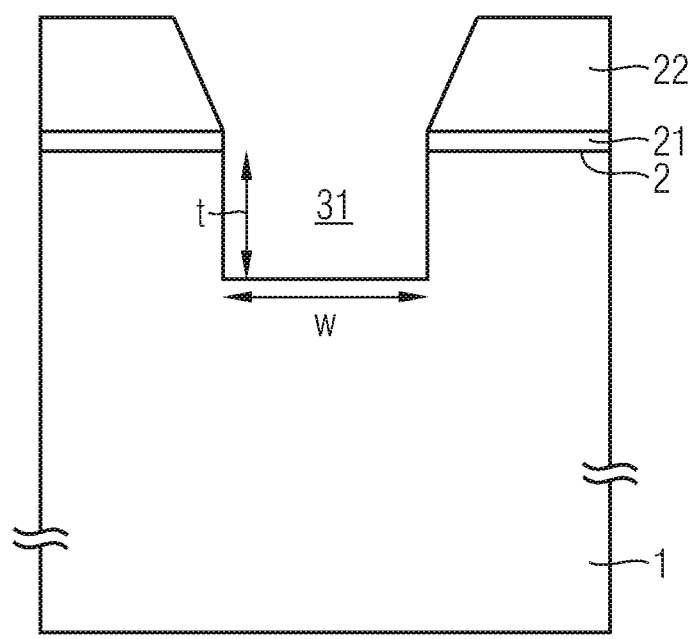

A pad nitride 21 ($Si_xN_y$, silicon nitride), which may have a thickness of about 100 to 400 nm, for example, 300 nm, is disposed on the substrate surface 2, followed by a silicon oxide mask layer 22 ($Si_xO_y$, silicon oxide). Although not shown, a thin pad oxide layer may be disposed below the pad nitride 21. The silicon oxide mask layer 22 may have a thickness of approximately 1 μm and more. The pad nitride layer 21 and the silicon oxide mask layer 22 are layers forming a hard mask during a following etching step. Nevertheless, as is clearly to be understood, alternative hard mask materials may be chosen. Further, depending on the depth of the trench, also a polysilicon layer (not shown) and/or a carbon layer (not shown) may be formed over or instead of the silicon oxide mask layer 22. The polysilicon layer or the carbon layer may be used for patterning the hard mask layer. Nevertheless, as is clearly to be understood, the hard mask layers may as well be patterned using photolithographical processes as is conventional. After correspondingly patterning the hard mask layer stack 21, 22, a first etching process is performed. For example, the first etching process may be an anisotropical etching process in which a vertical etching component is much larger than a horizontal etching component. For example, as is shown in FIG. 3, an upper trench portion 31 having approximately vertical sidewalls may be formed. The anisotropical etching step is performed to a depth which is much larger than the depth of a second isolation trench which is to be formed in a later processing step. For example, the depth t may be approximately 800 nm to 1.5 μm. The width w of the upper trench portion 31 corresponds to the opening of the hard mask. The width w of the upper trench portion 31 may be 2 to 3 μm. An example of a resulting cross-sectional view is shown in FIG. 3. For example, the etching process shown in FIG. 3 may be performed using an etching gas mixture of HBr/HCl.

Thereafter, an isotropic etching step is performed which is highly selective with respect to the oxide layer 22. Due to this etching step, a widened trench portion 32 is formed. The amount of widening s is controlled by controlling the etching time. For example, this etching may be accomplished using an $SF_6$ etching gas. For example, the amount of widening s may be approximately 200 to 350 nm on each side, for example, 250 to 300 nm. As will be explained in the following, due to this isotropic etching step, a portion of an insulating layer which is to be formed in the next processing step, will be buried and protected by the hard mask layer stack or a part of the hard mask layer stack. Accordingly, by controlling the amount of widening, the degree to which the insulating layer is protected by the hard mask layer stack can be controlled.

Figure 4:
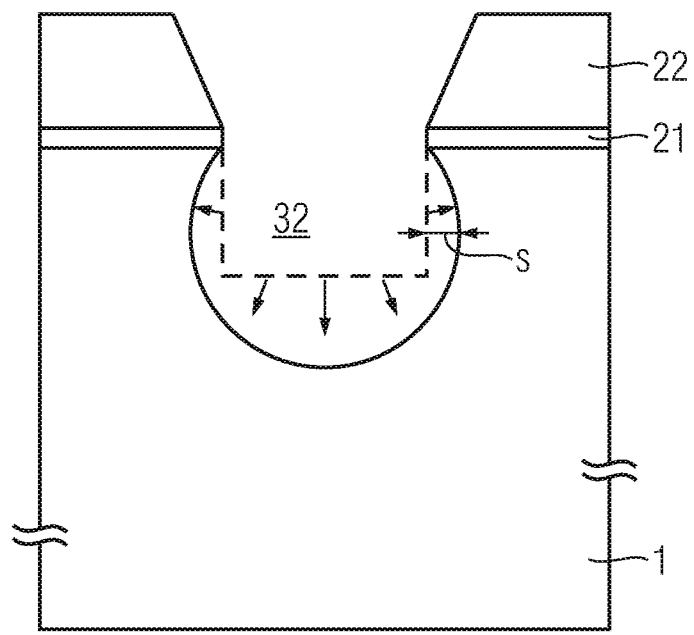

A cross-sectional view of an example of the substrate is shown in FIG. 4. Thereafter, a further anisotropic etching step is performed, for example by again changing the etching gas to HBr/HCl. Thereafter, an extended trench portion 51 is formed which may have a depth of approximately more than 15 μm, for example 20 μm, or more than 25 μm.

Figure 5:
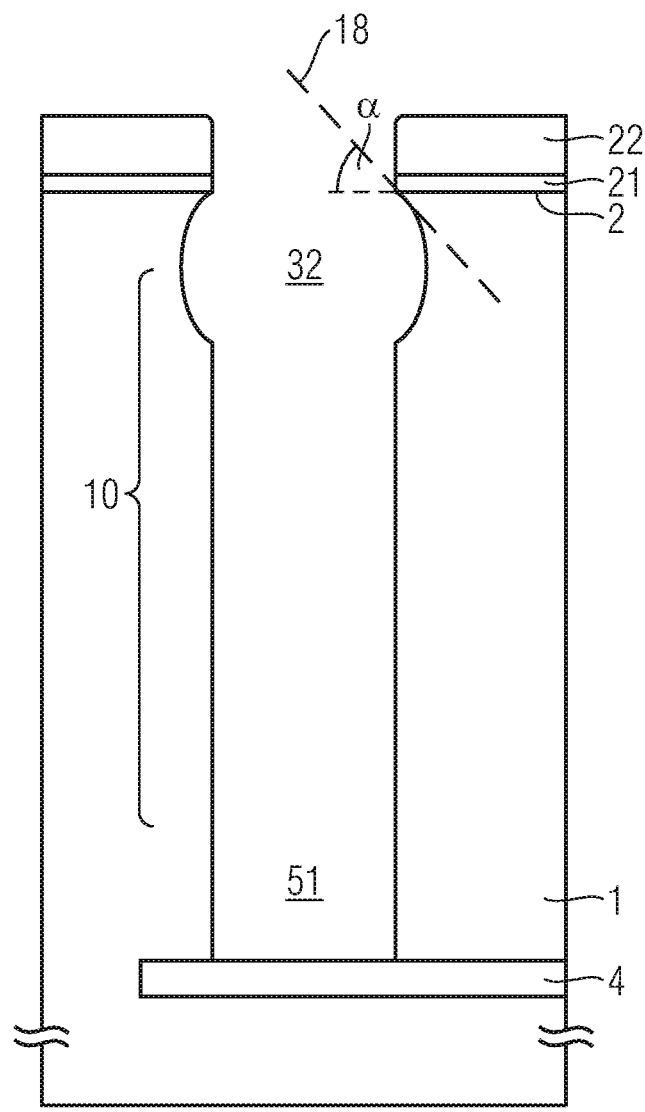

A cross-sectional view of an example of a resulting structure is shown in FIG. 5. As is further shown in FIG. 5, the tangent 18 at the upper portion of the side wall of the widened trench portion 32 has a so-called negative taper, which means that the angle α measured from the opening portion of the substrate is less than 90°. As is shown in FIG. 5, the resulting first trench 10 may extend to the buried layer 4.

Figure 6:
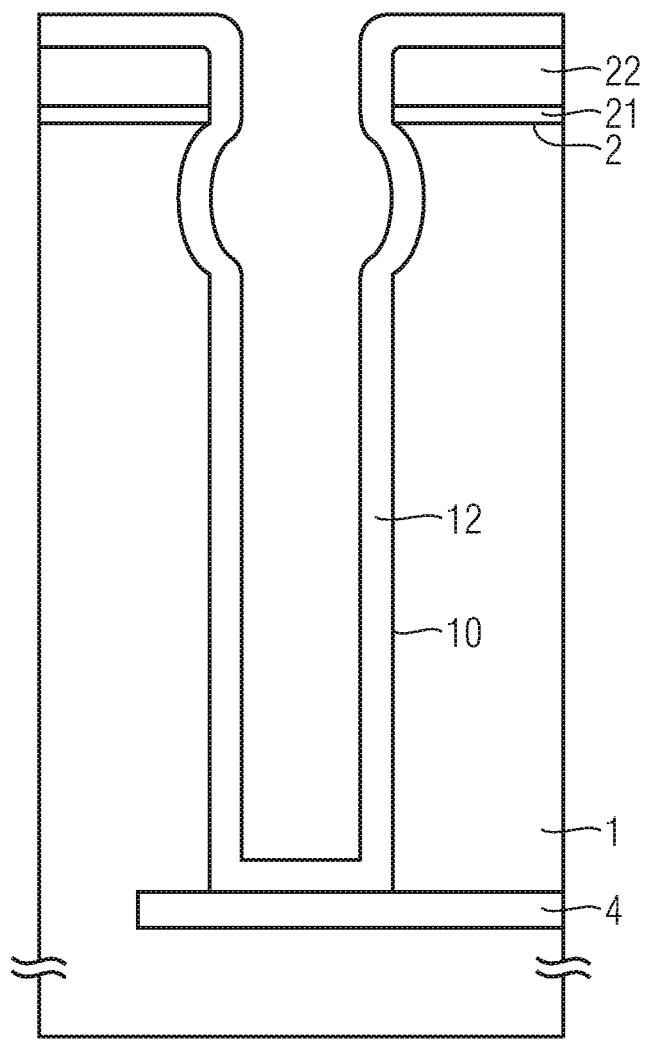

Thereafter, an insulating material 12 is formed on the sidewalls of the first isolation trench 10. For example, the insulating material 12 may comprise silicon oxide which may be formed by an LPCVD (low pressure chemical vapor deposition) method using TEOS (tetraethylorthosilicate) as a starting material. Nevertheless, further examples of insulating materials comprise thermal oxide, SiNx, SiOxNy, AlOx, ZrOx, TiOx and others or combinations or layer stacks of these materials. For example, the insulating material 12 may have a thickness of 400 to 1000 nm, for example 700 to 1000 nm. FIG. 6 shows an example of a resulting structure. As is shown in FIG. 6, inside the widened trench portion 32, a portion of the insulating layer 12 is disposed below the hard mask layer stack or a part of the hard mask layer stack comprising the silicon oxide mask layer 22 and the silicon nitride layer 21.

Thereafter, the horizontal portions of the insulating material 12 are etched, for example, using a plasma etching process using, for example, an etching gas comprising $C_xF_y$. Due to this etching, the bottom portion in the first isolation trench 10 is opened. Moreover, the horizontal portions of the insulating material 12 and portions of the silicon oxide mask layer 22 are removed. Due to the special shape of the upper portion of the widened trench portion 32, during this etching, the remaining mask portion 21, 22 protects the insulating layer 12 inside the widened trench portion from being etched.

Since the upper portion of the insulating material 12 in the widened trench portion 32 is protected by the hard mask layer stack 21, 22, the insulating layer 12 is not thinned in a region adjacent to the substrate surface 2. In other words, due to the special shape of the widened trench portion 32, the so-called collar portion of the first isolation trench 10 is not thinned.

Figure 7:
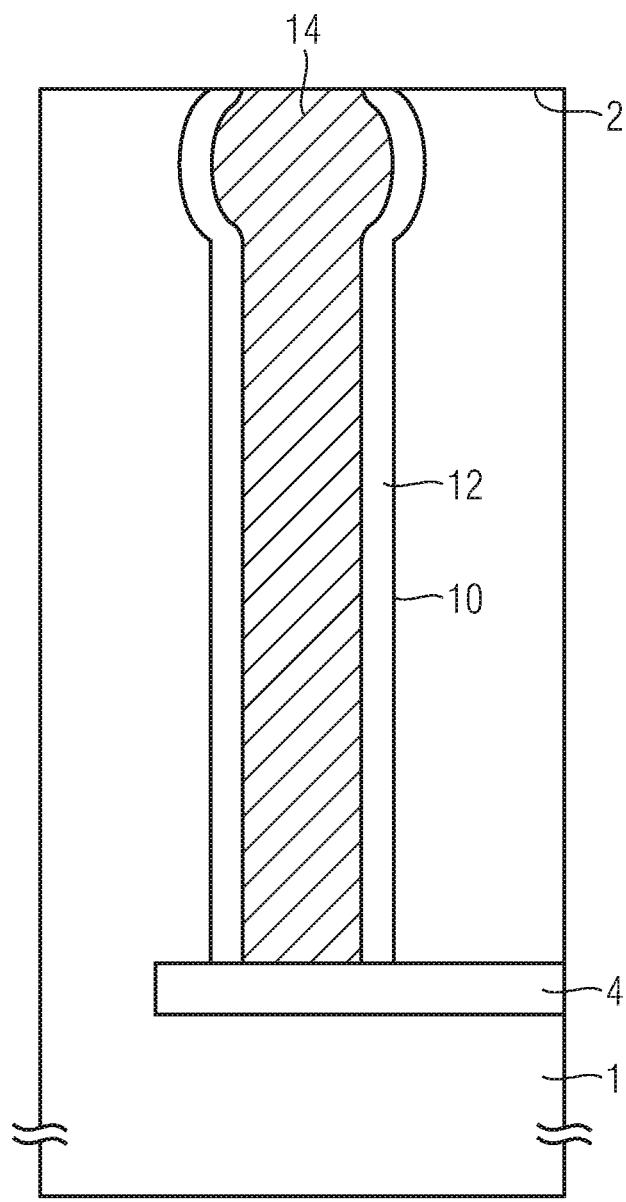

Thereafter, a conductive material 14 is filled in the first isolation trench 10. For example, the conductive material 14 may comprise polysilicon. Alternative conductive materials which may be filled in the trench comprise further metals such as W, Al, Cu, Ti, Co, graphite and others as well as electrically conductive metal-semiconductor compounds, nitrides or carbides as have been described above or any combination of these materials. Nevertheless, as is clearly to be understood, also other materials may be taken. Thereafter, etching back is performed so that no further conductive material 14 is disposed over the surface of the pad nitride layer 21. Thereafter, the pad nitride layer 21 and if present, remaining portions of the silicon oxide layer 21 are removed from the surface 2 of the semiconductor substrate 1. FIG. 7 shows an example of a resulting structure. As is shown in FIG. 7, the conductive material 14 contacts the buried layer portion 4.

Figure 8:
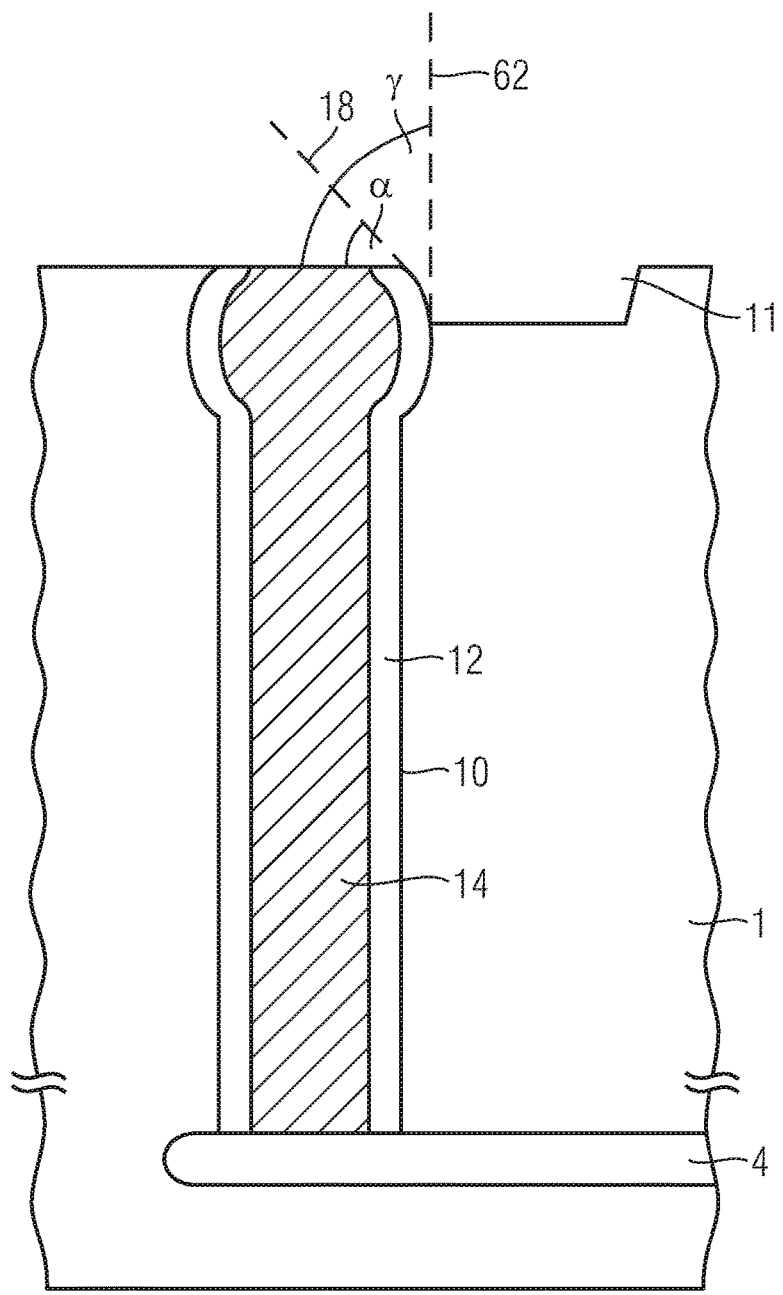

Thereafter, so-called shallow trench isolation trenches or second isolation trenches 11 are formed in the substrate surface 2. For example, these trenches may be formed by a plasma etching process which forms inclined sidewalls, i.e. sidewalls which are not perpendicular with respect to the substrate surface. The second isolation trenches 11 are etched so as to have a depth of less than approximately 400 nm. As is shown in FIG. 8, due to the feature that the first isolation trenches 10 have specially shaped sidewalls wherein a tangent 18 in the widened trench portion adjacent to the substrate surface 2 has a so-called "negative taper", the isolation trenches 11 can be etched without substrate residues remaining between the first insulating material 12 and the second isolation trenches 11. According to an embodiment, the angle α between the tangent 18 and the substrate surface 2 may be set so as to approximately correspond to the etching angle of the step for etching the second isolation trenches 11. In this case, the upper portion of the first insulating material 12 does not shadow the substrate material immediately adjacent to the first isolation trench 10, so that the substrate material can be etched without remaining residues. Moreover, the tangent 62 that is adjacent to the sidewall at a height which corresponds to a lower side of the second isolation trench 11 may have an angle γ with respect to the surface of the remaining substrate material or conductive material. The angle γ may be less than or equal to 90°. In this case during the step of etching the substrate material can be efficiently removed without remaining residues. An example of a resulting structure after performing a Chemical Mechanical Polishing (CMP) process and a deglazing process is shown in FIG. 8.

According to a further embodiment, also the conductive material 14 in the first isolation trench 10 may be etched during this etching step. For example, if the angle β as shown in FIG. 1B is approximately set, this etching may be performed without remaining residues adjacent to the sidewall 12b of the insulating material 12.

Although not shown the second isolation trenches 11 are etched using a resist mask and/or hard mask for patterning the isolation trenches 11.

Figure 9:
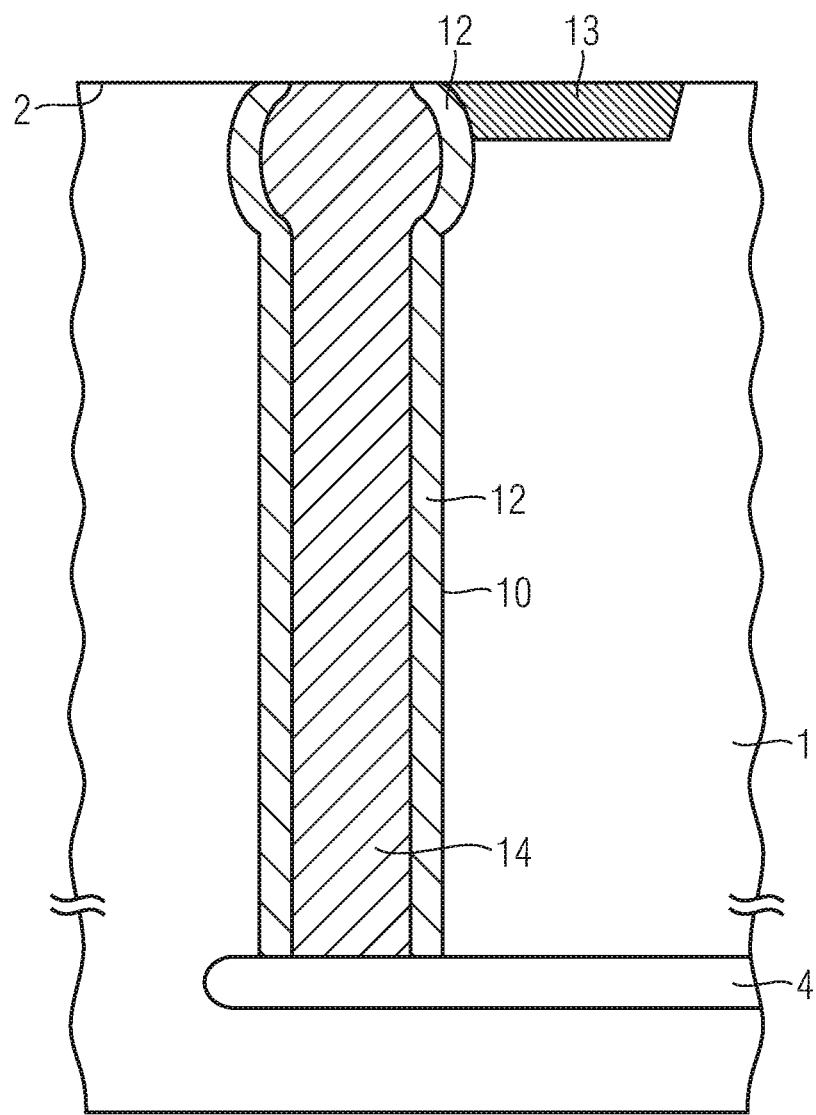

Thereafter, a second insulating material 13 is filled in the etched trenches 11. The second insulating material 13 may comprise any insulating material, for example, an insulating material as listed above. FIG. 9 shows an example of a resulting structure. As is shown, in FIG. 9, the first and second insulating materials 12, 13 are adjacent to each other without any substrate residues such as silicon spikes being disposed between the first and the second insulating material 12, 13.

Due to the higher thickness of the insulation material 12 at a surface portion of the first isolation trench 10, the resulting isolation trench can withstand higher voltages. For example, the shown isolation trench may be employed in so-called smart power technology which applies voltages of about 80 V and peak voltages of approximately 180 V. The shown isolation trench may be employed in high power technologies which are designed for average voltages of approximately 18 V having peak voltages of approximately 40 V. The isolation trenches may be used in devices which are suitable for switching higher voltages. For example, these devices may be employed in several fields such as automotive applications including airbag controllers and others.

FIG. 10 schematically illustrates a method for forming an integrated circuit according to an embodiment. As is shown, a method for forming an integrated circuit may comprise a first etching process (S10), and a second etching process (S20). Optionally, a third etching process (S30) may be performed after the second etching process (S20). For example, the first etching process may be an anisotropic etching process, wherein an etching rate in a depth direction of a semiconductor material is larger than an etching rate in a plane parallel to the surface of the semiconductor material. The second etching process may be an isotropic etching process, wherein an etching rate in the depth direction is approximately equal to the etching rate in the direction parallel to the surface of the semiconductor material. The method may further comprise a third etching process after the second etching process, wherein the third etching process is an anisotropic etching process in which an etching rate in the depth direction is larger than an etching rate in a plane parallel to the surface of the semiconductor material.

As has been explained above, one single etching device may be employed for performing the first, second and third etching processes. For example, switching between the first, second and third etching processes may be accomplished in a simple manner by changing the etching gases.

As has been discussed above, an integrated circuit, comprises a first trench being disposed in a semiconductor material, wherein a width of the first trench in an upper portion of the first trench adjacent to a surface of the semiconductor material is smaller than the width of the first trench in a lower portion of the first trench, the lower portion being disposed within the semiconductor material, the width being measured in a plane parallel to a surface of the semiconductor material, the width denoting a distance between inner faces of remaining semiconductor material portions or between outer faces of a filling disposed in the first trench, or between an inner face of a remaining semiconductor material portion and an outer face of a filling disposed in the first trench.

Although in the above description, specifically epitaxially grown semiconductor material has been specified as a semiconductor material, it is clearly to be understood that the integrated circuit may also be implemented using a polycrystalline or amorphous semiconductor material. Further, isolation trenches have been described as an example of the trenches which are a component of the integrated circuit. As is clearly to be understood, various further components may comprise the first trench as described above. For example contact holes may also implement the first trench as described above, and a method of forming a contact hole may also comprise the processes as described above.

Moreover, any kind of spacer may be formed using the method as described above, and an integrated circuit may be implemented by a spacer that is formed in the first trench as explained above.

While embodiments of the invention have been described above, it is obvious that further embodiments may be implemented. For example, further embodiments may comprise any sub-combination of features recited in the claims or any sub-combination of elements described in the examples given above. Accordingly, this spirit and scope of the appended claims should not be limited to the description of the embodiments contained herein.

What is claimed is:

1. A method of forming a contact structure, the method comprising:
    forming a trench that extends in a first direction from a main surface of a semiconductor body into the semiconductor body towards a rear surface of the semiconductor body, wherein forming the trench comprises:
    forming an upper trench portion;
    widening at least a part of the upper trench portion so as to form curved sidewalls in the upper trench portion that bow outward from a bottom of the upper trench portion;
    forming a lower trench portion having generally planar sidewalls extending from the bottom of the upper trench portion at a first depth into the semiconductor body along the first direction to a contact region at a second depth, the lower trench portion being narrower than the widened part of the upper trench portion;
    forming an insulation layer in the trench that completely lines the sidewalls and the bottom of the trench;
    removing a portion of the insulation layer from the bottom of the trench; and
    filling the trench with an electrically conductive material such that the electrically conductive material directly contacts the contact region,
    wherein the trench is formed such that the upper trench portion directly intersects the main surface of a semiconductor body, wherein a width of the upper trench portion at a location where the upper portion directly intersects the main surface is greater than a maximum width of the lower trench portion, and wherein the curved sidewalls extend from the main surface of a semiconductor body to the lower trench portion.

2. The method of claim 1, wherein a distance from the first depth to the second depth is larger than a distance from the main surface to the first depth.

3. The method of claim 1, wherein a distance from the first depth to the second depth is at least five times larger than a distance from the main surface to the first depth.

4. The method of claim 1, further comprising performing a planarization process that removes semiconductor material from the main surface of a semiconductor body.

5. The method of claim 4, wherein performing the planarization process comprises removing at least a part of the electrically conductive material.

6. The method of claim 1, wherein the curved sidewalls extend from the first depth to the main surface.

7. The method of claim 6, wherein the curved sidewalls are bowed outward from the first depth to a third depth shallower than the first depth and wherein the curved sidewalls are bowed inward from the third depth to the main surface of the semiconductor body.

8. The method of claim 1, wherein the contact region is a buried doped semiconductor layer.

9. The method of claim 1, wherein the generally planar sidewalls extend parallel to one another from the first depth to the second depth.

10. The method of claim 1, wherein forming the upper trench portion comprises:
    forming a patterned mask structure on the main surface of the semiconductor body, the patterned mask structure comprising an opening that exposes a portion of the main surface;
    forming the upper trench portion comprising sidewalls that are generally perpendicular to the main surface; and
    wherein the widening of at least a part of the upper trench portion comprises:
    widening the upper trench portion to transform the generally perpendicular sidewalls into the curved sidewalls.

11. The method of claim 10, wherein the patterned mask structure comprises an oxide layer formed directly on the main surface and a nitride layer formed on the oxide layer, wherein forming the upper trench portion comprises performing a first anisotropic etching process, wherein the widening of at least a part of the upper trench portion comprises performing an isotropic etching process, and wherein forming the narrower lower trench portion comprises performing a second anisotropic etching process.

12. The method of claim 1, wherein the trench is formed as a first trench in the semiconductor body, the method further comprising:
    forming a second trench that extends from the main surface of the semiconductor body towards the rear surface, the second trench being shallower than the first trench,
    wherein the second trench is formed directly adjacent to the first trench such that a sidewall of the second trench is coextensive with the insulation layer that lines the curved sidewall of the upper trench portion.

13. The method of claim 12, wherein forming the second trench comprises etching semiconductor material from the semiconductor body to expose a span of the insulation layer that lines the curved sidewall and is beneath the main surface.

14. The method of claim 13, further comprising filling the second trench with an insulating material such that the insulating material directly contacts the span of the insulating layer, wherein an interface between the insulating material and the span of the insulation layer is devoid of substrate residue.

* * * * *